United States Patent
Leyh

(10) Patent No.: US 9,083,157 B2
(45) Date of Patent: Jul. 14, 2015

(54) COLLAPSIBLE HIGH-VOLTAGE ELECTRICAL DISCHARGE GENERATOR

(71) Applicant: Greg Leyh, Brisbane, CA (US)

(72) Inventor: Greg Leyh, Brisbane, CA (US)

(73) Assignee: Gregory E. Leyh, Brisbane, CA (US)

( * ) Notice: Subject to any disclaimer, the term of this patent is extended or adjusted under 35 U.S.C. 154(b) by 137 days.

(21) Appl. No.: 13/797,695

(22) Filed: Mar. 12, 2013

(65) Prior Publication Data

US 2013/0271892 A1    Oct. 17, 2013

Related U.S. Application Data

(60) Provisional application No. 61/610,143, filed on Mar. 13, 2012.

(51) Int. Cl.
*H01T 23/00* (2006.01)
*H01T 21/00* (2006.01)
*G01R 31/14* (2006.01)

(52) U.S. Cl.
CPC ............... *H01T 23/00* (2013.01); *G01R 31/14* (2013.01); *H01T 21/00* (2013.01); *Y10T 29/4902* (2015.01)

(58) Field of Classification Search
CPC ......... H01T 23/00; H01T 21/00; G01R 31/14
See application file for complete search history.

(56) References Cited

U.S. PATENT DOCUMENTS

| | | | | |
|---|---|---|---|---|
| 1,119,732 | A * | 12/1914 | Tesla | 343/850 |
| 2,739,850 | A * | 3/1956 | Hollingsworth | 52/121 |
| 3,364,488 | A * | 1/1968 | Perenic et al. | 343/723 |
| 3,678,653 | A * | 7/1972 | Buschman | 96/66 |
| 4,336,561 | A * | 6/1982 | Murphy | 361/19 |
| 4,404,565 | A * | 9/1983 | Gurney et al. | 343/881 |
| 8,684,327 | B2 * | 4/2014 | Caswell | 248/519 |
| 2002/0021201 | A1 * | 2/2002 | Ol | 336/197 |

OTHER PUBLICATIONS

Electrical resistivity and conductivity, Aug. 30, 2014, wikipedia, link: http://en.wikipedia.org/wiki/Electrical_conductivity.*

* cited by examiner

*Primary Examiner* — Zeev V Kitov

(57) ABSTRACT

A collapsible, high voltage electrical discharge generator uses a set of telescoping winding sections to achieve a compact form suitable for efficient transport, storage and deployment. The winding sections have two typical arrangements, fully collapsed and fully extended. In the fully collapsed mode the sections can be telescoped together into a nested configuration, thus occupying a small fraction of the volume of a fully extended system. The towers can be erected into the fully extended mode by applying internal pressure, or alternatively by using mechanical linkage to simply extend the telescoped stack of winding sections into position. Fully extended and connected, the individual sections perform as a large, continuous inductive element capable of generating very high voltages at the top of the tower for use in testing equipment and producing long electrical discharges.

7 Claims, 9 Drawing Sheets

Extended Winding Sections and Top Electrode.

Extended Winding Sections and Top Electrode.

Nine Winding Sections in a Collapsed Configuration.

Components of a Conic Winding Section.

Components of a Prismatic Winding Section.

Tower Arrangement with Lifting Actuators.

Winding Sections Joined By Flexible Membranes.

Tower Arrangement with Cylindrical Winding Sections.

Top Electrode with Curved Collapsible Components.

Top Electrode with an Inflatable Envelope.

COLLAPSIBLE HIGH-VOLTAGE ELECTRICAL DISCHARGE GENERATOR

CROSS-REFERENCE TO RELATED APPLICATIONS

This application claims priority to U.S. Provisional Patent Application 61/610,143, filed Mar. 12, 2012, which is incorporated by reference herein.

FIELD OF THE INVENTION

The invention relates generally to apparatus and methods for generating high voltage and, in particular, to the utilization of collapsible elements for efficient transport, deployment and storage of large-scale high voltage apparatus.

BACKGROUND OF THE INVENTION

Machines that produce very long electrical discharges find use in a wide variety of applications including industrial equipment testing, basic research and scientific demonstrations. Typically these Extra-High Voltage (EHV) machines comprise large transformers, capacitor banks or electrostatic induction machines such as Van De Graaf generators.

For lightning susceptibility tests of equipment, the device under test is typically placed within striking range of the EHV generator and electrically grounded. Long electrical discharges from the EHV generator ultimately find their way towards and attach to the device under test. The current that passes through the body of the device and the concentrated heat at the attachment point of the arc are configured to simulate the effects of a natural lightning strike. These tests are often performed on critical items such as aircraft, fuel tanks, antenna structures, and emergency shelters.

For scientific research applications, long arc discharges are used in experiments to perform atmospheric electricity studies, weather modeling, and characterization of geospace components such as the ionosphere and the Earth Schumann Resonance. Long arc discharges also find use in many scientific demonstrations for the general public, providing viewers a rare glimpse of the spectacular dynamics and destructive potential of long electric arcs in air, and their effects on familiar items such as electronics, vehicles, and buildings.

Long electrical arcs in the range of three to three hundred meters in length are required for most demonstrations and testing applications. Under normal conditions, electrical arcs greater than 3 meters in length require drive voltages of at least 350,000 volts. For larger scale applications, operating voltages can extend into the megavolt range. The embodiments of the invention disclosed herein provide methods for generating localized electrical discharges greater than 3 meters in length, fulfilling the needs of most testing, research and demonstration applications.

EHV machines typically comprise large, permanent facilities, since they must necessarily support heavy high-voltage components and maintain large clearance distances. A standard six megavolt impulse generator for testing power grid equipment can reach over 20 meters in height and weigh many tons. As a consequence, existing EHV facilities are limited to applications where the equipment to be tested can be transported to the EHV discharge generator itself.

Clearly, a collapsible large-scale electrical discharge generator capable of economic transport and deployment could fulfill many new and useful services, including testing of items that are difficult to move such as large aircraft, or permanent items such as buildings and equipment installations. The embodiments of the invention disclosed herein provide a number of novel innovations towards realizing a practical, collapsible and transportable large-scale EHV electrical discharge generator.

An induction coil provides one method for generating high voltage electrical discharges. A rapidly changing magnetic field passing through the induction coil generates a corresponding voltage between the ends of the coil. For large induction coil dimensions and fast moving magnetic fields, millions of volts can be realized. Variants of this method include adding resonant circuitry to the induction coil, which can modify the effective output impedance and improve overall efficiency in certain applications.

SUMMARY OF THE INVENTION

The collapsible Extra-High Voltage (EHV) generation system comprises one or more high voltage tower structures, which can operate independently or in unison.

Although a single tower structure can produce electrical discharges into the air or to grounded objects, multiple towers can provide greater control towards producing electric discharges of the desired length and direction to objects under test. A vertical tower arrangement is often used since the high voltage end of the inductive element requires a significant clearance to earth ground.

There are several major obstacles towards realizing a large-scale high voltage machine that can be economically and repeatedly collapsed:

1. A collapsible tower design requires sections that are largely hollow in nature.
2. A tall, hollow tower design requires structural materials with a high strength to weight ratio.
3. The structural materials forming the tower sections cannot be electrically conductive.
4. The structural materials forming the tower sections must support very high voltage gradients.
5. The system for extending and supporting the tower sections cannot be electrically conductive.
6. The system for extending the tower sections also must support very high voltage gradients.
7. The top electrode must provide a smooth, conductive outer surface with a complex contour, yet be readily collapsible.

In one embodiment of the invention, each high voltage tower consists of two or more vertically arranged winding sections, with a collapsible high voltage electrode located at the top of the tower structure. A winding section comprises a cylindrical or conic support structure containing an electrical winding and a set of connections, which, in conjunction with other winding sections, form one large inductive element capable of producing high voltage. The winding sections have two typical arrangements, fully collapsed and fully extended. In the fully collapsed configuration, the sections can be stacked or 'telescoped' into a nested arrangement. This collapsed arrangement greatly minimizes the total volume of the sections, providing an efficient, compact, repeatable solution for transport or storage. Once transported to the desired location the towers can be readily deployed by either stacking the individual winding sections with a crane or scaffolding, or by using internal pressure or mechanical linkage to automatically extend the 'telescoped' stack of winding sections into a tower arrangement. Once the sections reach their final extended positions, the electrical connections linking the sections together can be made either automatically or by hand. The tower now acts as one large inductive element, ready to produce high voltage.

DETAILED DESCRIPTION OF THE INVENTION

The collapsible EHV electrical discharge generator disclosed herein provides an economical approach towards a transportable system capable of producing long electrical discharges in air. The system comprises one or more collapsible large-scale tower structures, each supporting a set of winding sections capable of generating high voltage.

Figure 1:
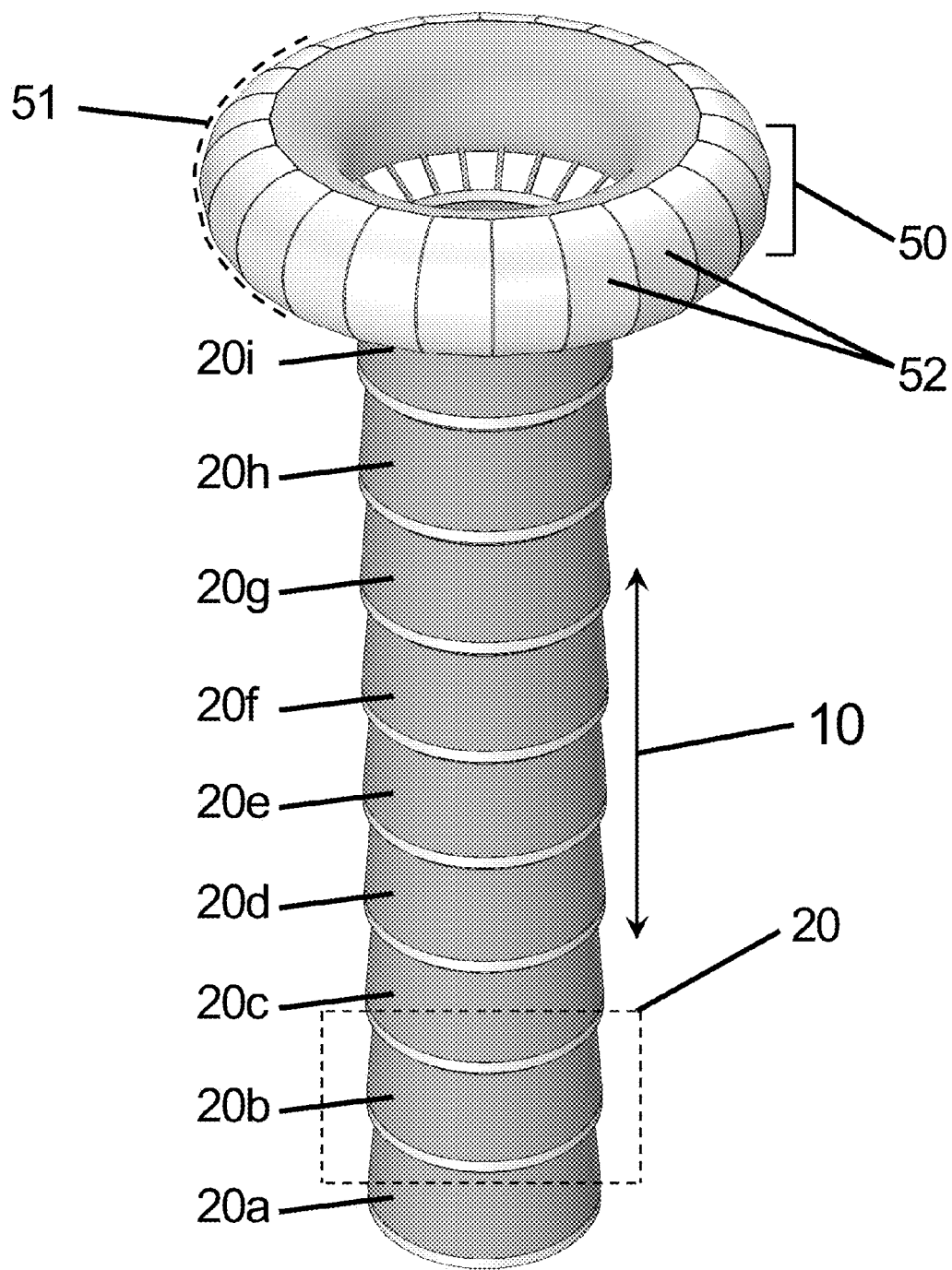
FIG. 1 shows an Extra-High Voltage (EHV) generation system comprising a number of electrically connected winding sections in a tower arrangement and a top electrode comprising a number of conductive modular components forming a toroidal envelope shape, according to an embodiment of the invention.

FIG. 1 shows an Extra-High Voltage (EHV) generation system comprising a number of identical, vertically arranged winding sections 20a-i, and a high voltage electrode 50 located at the top of the tower structure. Although FIG. 1 shows nine identically formed winding sections, any convenient number of sections can be employed to provide a desired degree of compaction. The winding sections 20a-i in FIG. 1 are in a fully extended arrangement 10.

Figure 2:
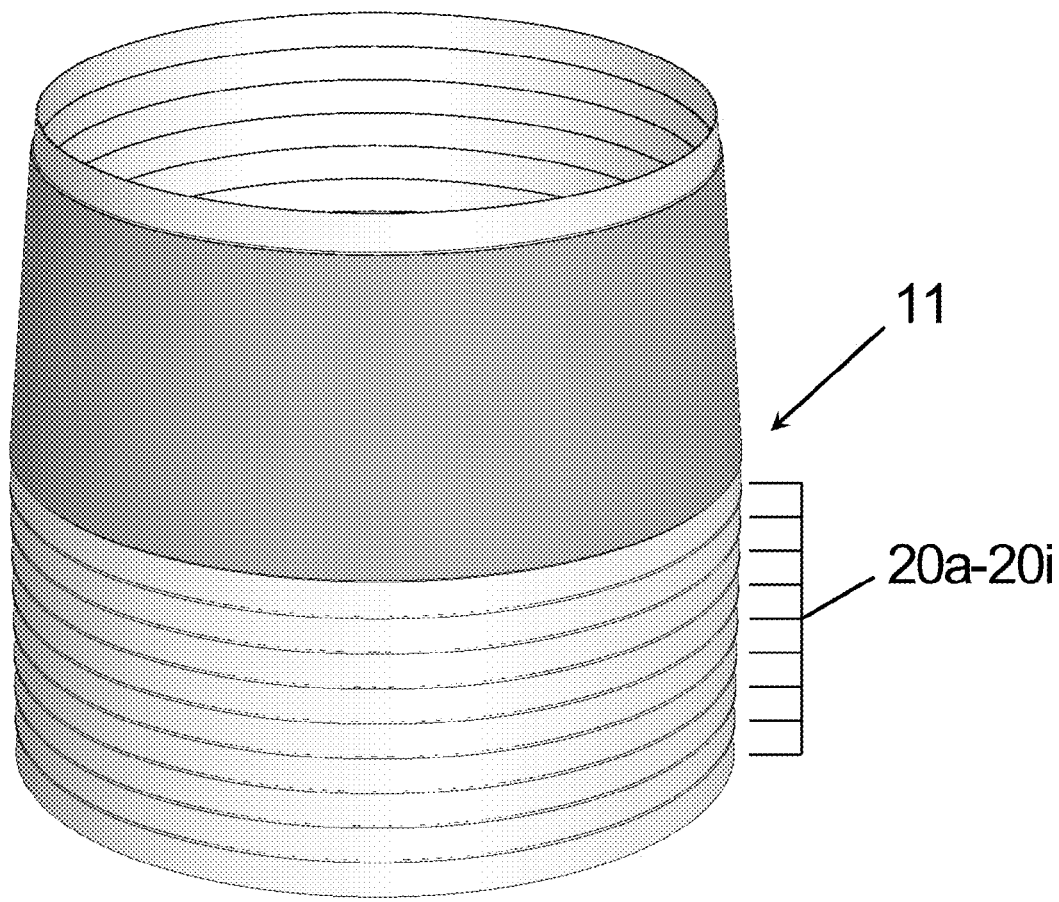
FIG. 2 shows a group of winding sections with a conic shape nested into a fully collapsed arrangement suitable for transport or storage.

FIG. 2 shows the winding sections 20a-i in a fully collapsed arrangement wherein the sections are stacked or 'telescoped' into a nested configuration 11. The nested configuration 11 has a greatly reduced total volume, providing an efficient, compact arrangement for transport or storage.

In an embodiment illustrated by FIG. 1, the winding sections 20a-i are arranged into a tower arrangement 10 and electrically connected in series, providing a large continuous inductive element comprising the sum total of the section inductances plus the sum total of the winding lengths of all of the winding sections combined. A person normally skilled in transformer design would note that such a large, continuous, inductive element could be excited magnetically from a nearby drive coil, excited electrically through electric fields coupled to the top electrode, or excited directly by a suitable AC voltage generator in electrical connection to the base winding section.

The maximum possible output voltage the tower arrangement can produce is ultimately determined by the total winding length, and by how much stress the section materials can withstand. For most suitable insulating construction materials such as plastics or fiberglass, 600-1500 volts/cm describes a reasonable range of surface operating stress. In one arrangement, about one meter of winding length is provided for each 120,000 volts of output required by the tower structure. Construction materials, such as paper, that absorb moisture are less expensive, but will result in lower allowable operating stresses and significantly shorter lifetimes. As the winding sections telescope together, it is also useful to include a means for preventing the insulating surfaces of adjacent sections from scraping against each other, as this could significantly reduce their useful lifetime.

Figure 3:
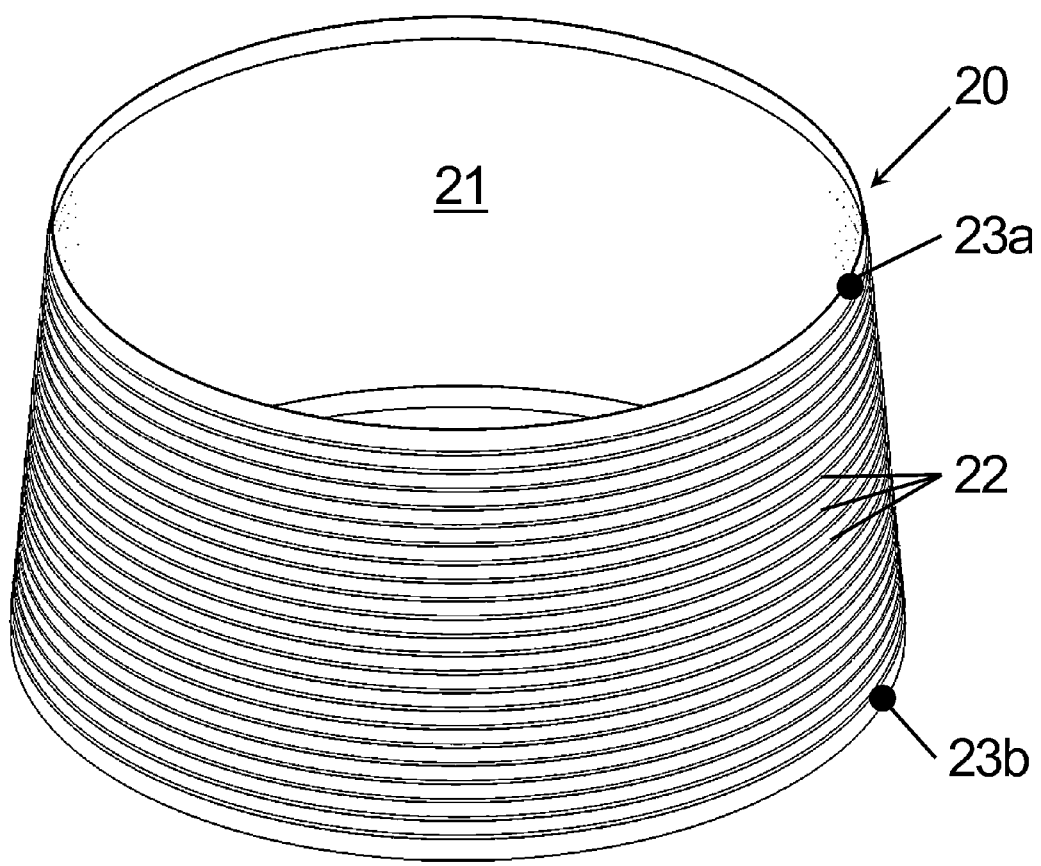
FIG. 3 illustrates components of a winding section, according to an embodiment of the invention.

Components of a winding section are illustrated in FIG. 3. Each winding section 20 comprises a support structure 21, the inductive winding 22 and electrical connections 23a-b each end of the winding 22. In an embodiment, the support structure 21 comprises an insulating sheet material formed into a thin-walled conic section, capable of supporting an electrical winding. Examples of useful materials include, but are not limited to, rubber, plastics and fiber composites. The winding 22 comprises a continuous wrapping of wire longitudinally along the surface of the support structure 21. Typically a winding is specified as a number of turns, wherein each complete turn involves one run of wire longitudinally around the section. The winding 22 can be embedded into the support structure 21, or can be attached to the outer surface of the support structure by adhesive, ties, or any convenient, non-conductive means of fastening.

The number of turns in each section determines the natural frequency of the tower. Adding turns decreases the frequency while subtracting turns increases the frequency. In an embodiment, winding sections with differing numbers of turns can be combined in various combinations, allowing the erected towers to operate over a wide range of prescribed frequencies.

The electrical connections for each section are located at each end of the winding at 23a and 23b, respectively. Any convenient commercial electrical connector rated for the RMS output current can be used for this application, and can be mounted at each end of the winding 23a and 23b as shown. It is important to note that the frequency rating of the connectors is not critical for this application, since the wavelengths involved are very long compared to the feature size of the connectors. In addition, it is not critical to rate the connectors for the peak output currents since the timescales involved are very long compared to the thermal time constants of the connector materials.

In an embodiment, the connectors 23a and 23b accept short conductive jumpers (not shown) that bridge between adjacent sections 20a-i. The connections between adjacent winding sections are made typically once the sections move into their extended positions, allowing the erected tower to form one continuous inductive element. The jumpers can be placed manually, or by automatic guides that mate the connectors and jumpers as the sections move into their fully extended positions.

Figure 4:
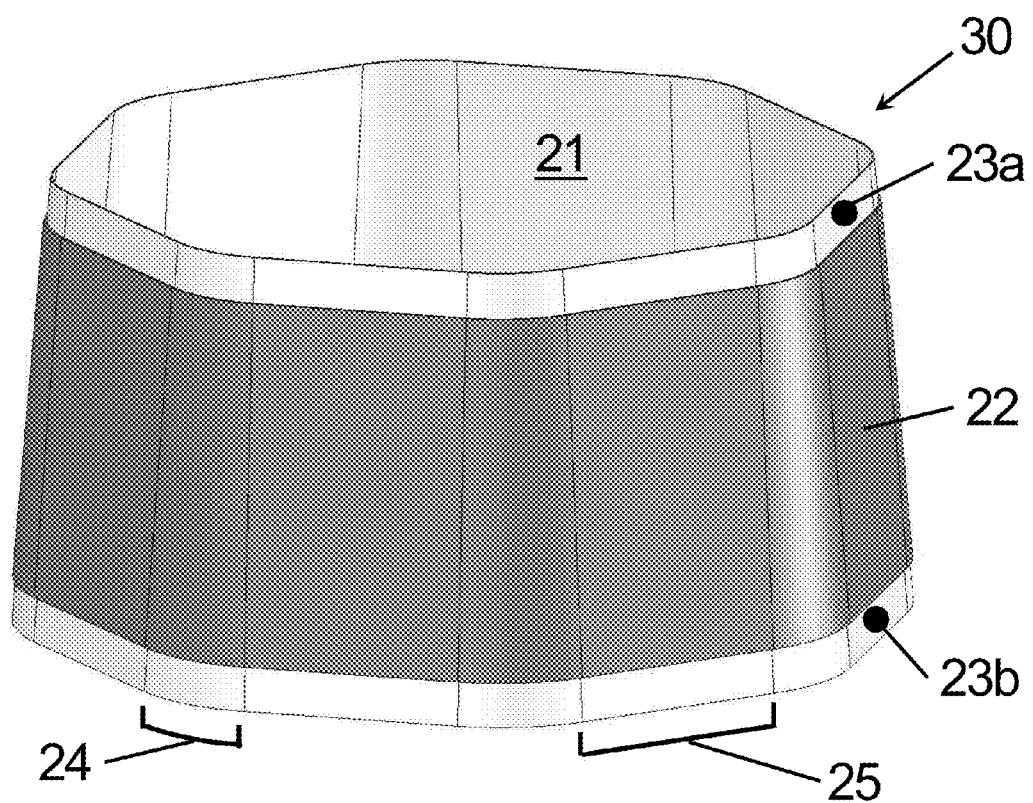
FIG. 4 shows a winding section with a prismatic shape, according to an embodiment of the invention.

FIG. 4 shows an embodiment of a winding section 30 with a prismatic shape. This approach offers the advantage of allowing the support structure 21 to be built from planar materials, but at the cost of increased electric field stresses along the bend areas 24 connecting the facet areas 25. It is useful to control electric field stresses by either increasing the number of facets 25 or increasing the radius of the bends 24. The electrical connections can be located at the ends of the winding 23a and 23b in a fashion similar to that described for the conic winding section 20 in FIG. 3. The winding sections can assume any cross-sectional shape that supports an electrical winding.

There are several practical approaches for configuring the winding sections and a top electrode into a tower arrangement. In an embodiment, the tower structure of FIG. 1 comprises a number of hollow winding sections that form a tower arrangement by using a crane or scaffolding to manually stack and bolt the individual winding sections and top electrode together. Although this approach affords a simple and inexpensive overall design, it may involve more setup and labor to collapse, transport and erect the system than for other embodiments.

Another approach for deploying the towers, particularly in remote locations, involves providing a lifting system integral to the winding sections themselves. However, this presents a formidable engineering challenge since well-known, high-strength materials such as carbon, iron and steel alloys cannot be placed inside the high voltage gradient zones of the tower due to their electrical conductivity.

Figure 5:
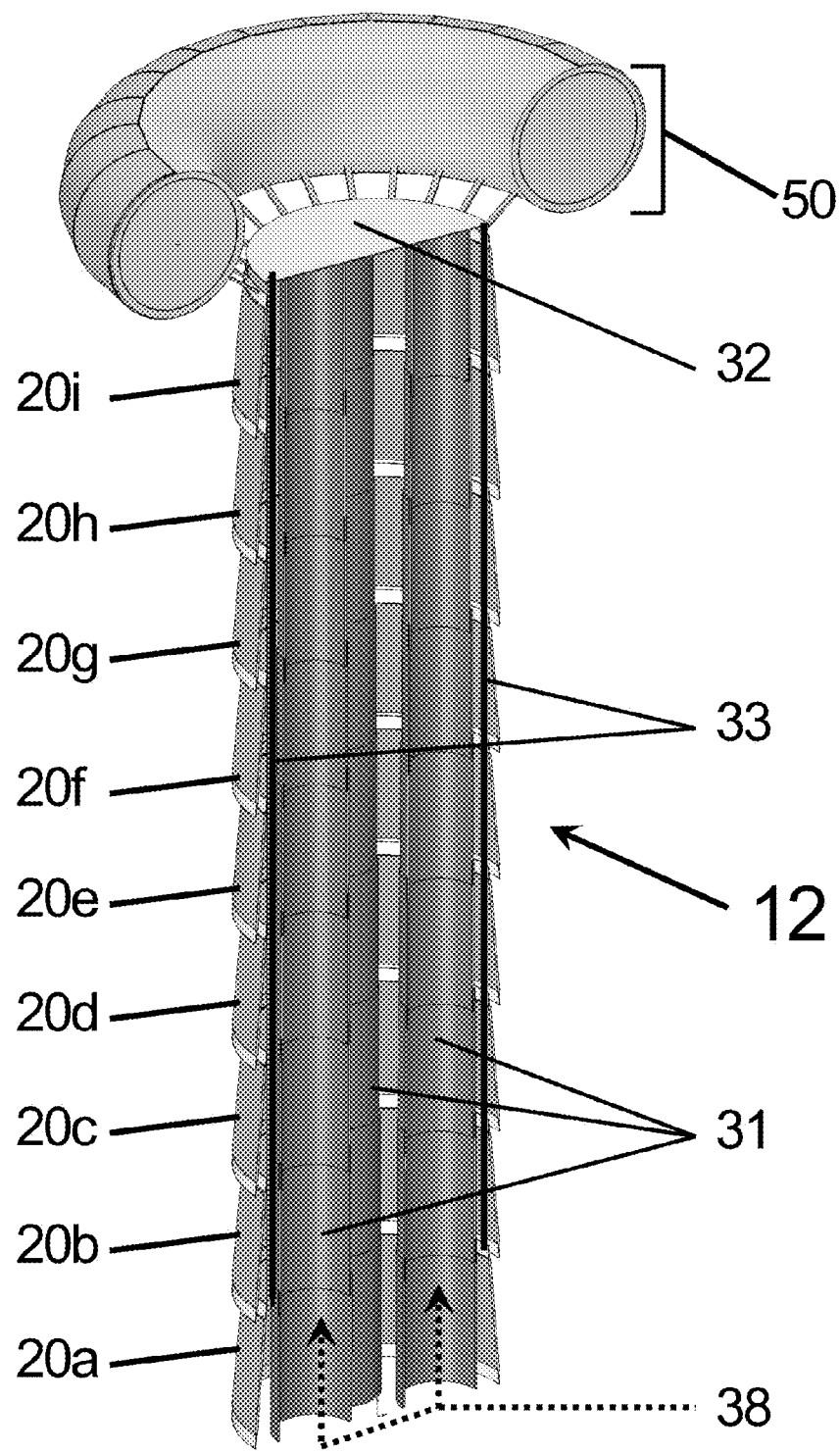
FIG. 5 provides a cutaway view of an Extra-High Voltage (EHV) generation system with lifting actuators supporting the winding sections and top electrode.

One approach involves adding lifting actuators specially constructed from electrically insulating materials. FIG. 5 shows an embodiment wherein the tower arrangement 12 features a number of telescoping lifting actuators 31 located inside the winding sections 20*a-i*. Each actuator 31 comprises a number of sealed, non-conductive pipe sections that telescopically extend by applying internal pressure 38. The lifting actuators 31 provide vertical lift in concert to the structural top plate 32, which in turn supports both the top electrode 50 and the winding sections 20*a-i* through the hanging support cables 33. Although a single telescoping lift actuator could support the tower components, employing several lift actuators in parallel can offer improved lateral stability and control as the tower rises into position. The telescoping lifting actuators can be located either outside (not shown) or inside the winding sections, although placing them inside the sections can improve overall compactness of the design. Alternatively, the lifting actuators could employ a combination of internal mechanical means including non-conducting screw mechanisms, pneumatic chambers, pulleys and electrically insulating tensile elements such as Kevlar or Spectra cables, provided that the entire lifting actuator assembly can support high electric voltage gradients in the vertical direction.

Figure 6:
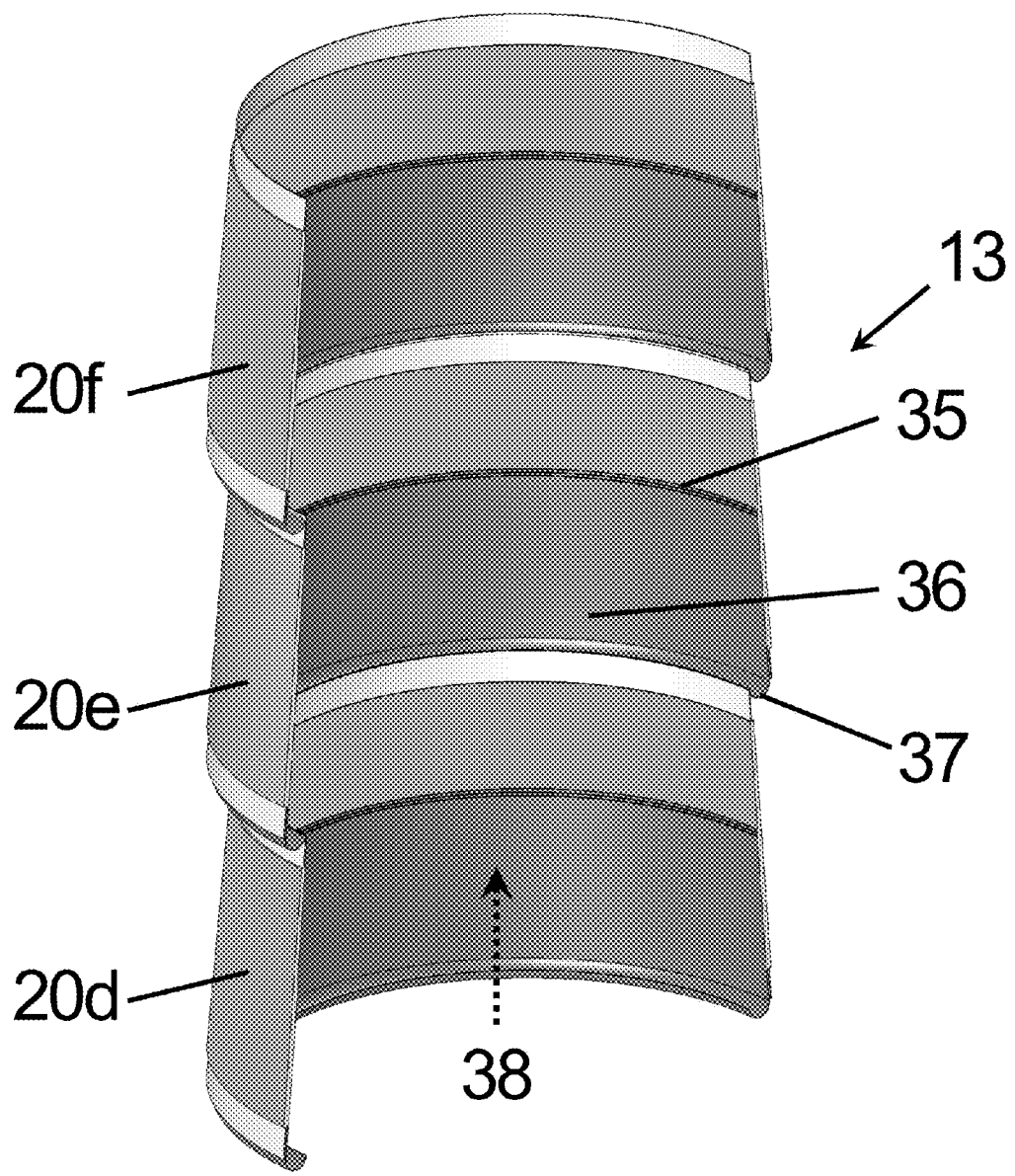
FIG. 6 provides a cutaway view of flexible membranes connected between adjacent winding sections, according to an embodiment of the invention.

In another embodiment illustrated by FIG. 6, a flexible membrane 36 connects between adjacent winding sections 20, sealing the internal volume of the tower and allowing it to be pressurized. The membrane 36 can be made of any flexible, electrically insulating material, including but not limited to rubber, plastic, or sealed fabric. Applied internal pressure 38 can then produce sufficient axial force to directly raise and lower the tower elements, eliminating the need for an external crane or scaffolding. Each flexible membrane 36 attaches to the inside of a section at the seam 35 and also attaches along the top edge of the section immediately below. The flexible membrane 36 can attach permanently at the seam 35 to provide the best air-tight performance, although a serviceable seam such as provided by a zipper or Velcro would greatly facilitate repairs and alterations. In FIG. 6 the membrane 36 features a belled shape 37, which allows the membrane to freely roll between the sections as they collapse, while maintaining a pressure seal. However the membrane 36 can also be configured as a bellows arrangement, an elastic sheet, a rolling skirt, or any configuration that provides a continuous seal between the sections 20 as they extend and collapse.

As the tower inflates, each section rises out of the stack in sequence. The top section will rise first since it carries the lowest total dead weight. Once the membrane 36 between two sections unrolls and reaches its fullest vertical extent, the next section below begins to rise in the same fashion. At this point, the electrical connections between the sections can be made either manually or by the use of guides that automatically mate the connectors as they approach each other. Once all of the sections reach their fullest vertical extent, the tower is ready for high-voltage generation.

The arrangement 13 provides the highest degree of lift for a given internal pressure, since the entire cross-section of the tower contributes towards generating lift. In addition, this arrangement allows the tower walls to be built from relatively thin sheet materials, since the internal pressure 38 also provides lateral structural support for the sections instead of rigid internal lattice-work.

Although any non-conductive pneumatic or hydraulic medium can be used to apply the internal pressure, dry air offers a very economical solution that can also withstand the high voltage gradients necessary for most applications. The pressurized air can be provided by any convenient means, including mechanical pumps or compressed air stored in pressure vessels. This source of compressed air should be rendered as dry as possible before entering the internal volume of the tower to maximize the dielectric strength and the useful lifetime of the internal surfaces of the tower.

Figure 7:
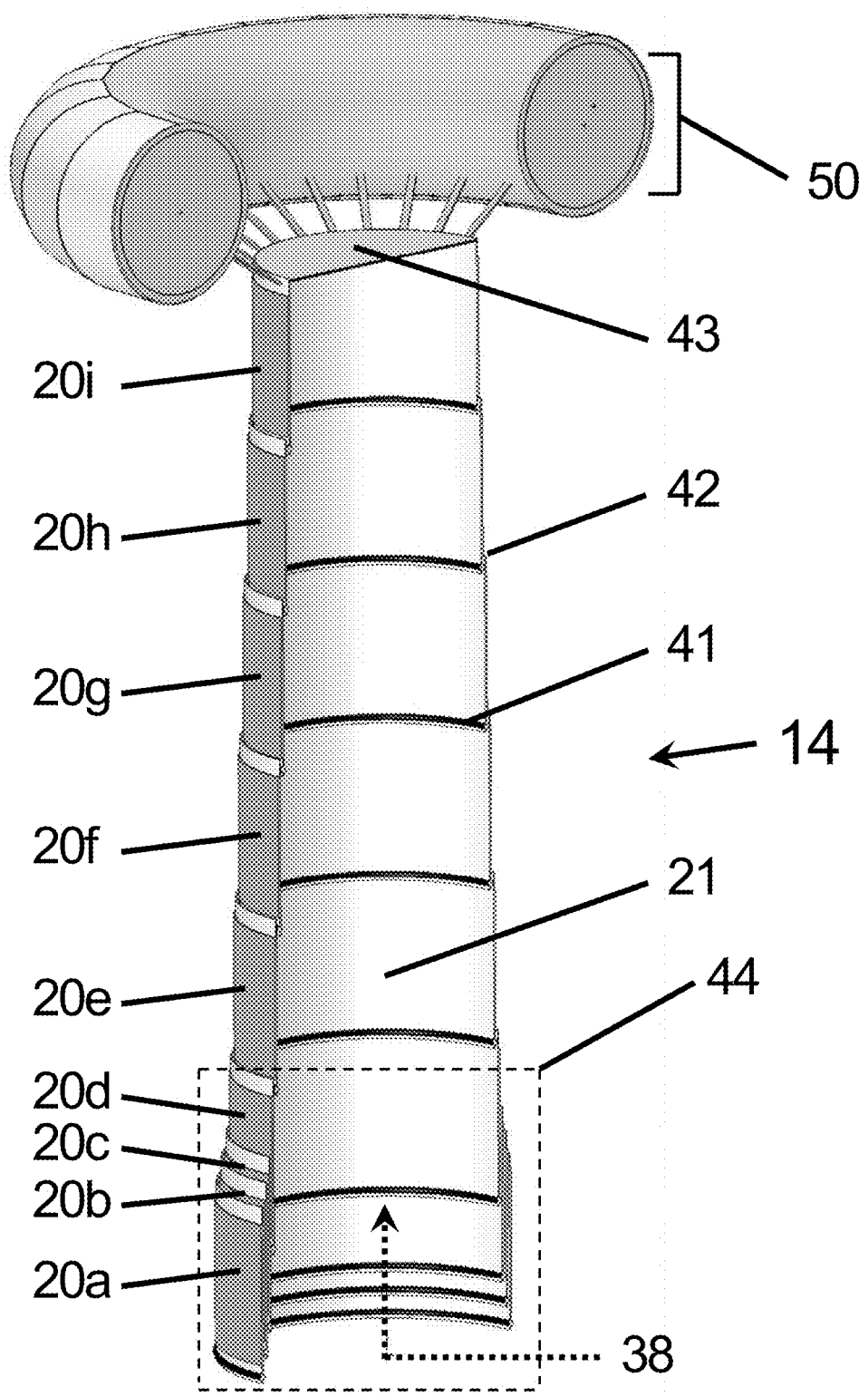
FIG. 7 provides a cutaway view of an Extra-High Voltage (EHV) generation system comprising a number of telescoping winding sections with a cylindrical shape.

In another embodiment illustrated by FIG. 7, the telescoping winding sections 20*a-i* are cylindrical in shape, with progressively smaller diameters chosen such that they snugly fit inside one another. This configuration 14 is able to maintain a sealed, inflatable internal volume through the elegant approach of a sliding gasket 41 between adjacent sections. Although not shown in this view, the cylindrical winding sections share many of the functional components of the conic winding section shown in FIG. 3, including the support structure 21, a winding 22 and a set of electrical connections 23*a-b*. Mechanical stops 42 located at the (top) ends of each winding section limit the vertical travel and support the hanging weight of the winding sections. As external pressure 38 is applied to the internal volume of the tower, the top plate 43 generates lift, raising the cylindrical winding sections vertically in sequence, similar to a multi-stage pneumatic cylinder. Detail 44 shows the lifting sequence in progress, with sections 20*a-c* still in their collapsed positions and 20*d* just beginning to lift.

In one embodiment, extending the tower components comprises the steps of:
 a. providing two or more hollow electrical winding sections configured to form a tower arrangement and to connect electrically with one another;
 b. configuring an inflatable internal volume inside said winding sections;
 c. pressurizing said internal volume and configuring said winding sections into a tower arrangement;
 d. providing modular electrode components configured to form a top electrode with a toroidal shape;
 e. forming electrical connections between adjacent winding sections;
 f. placing said toroidal electrode at the top of the tower;
 g. making an electrical connection between the electrode and the tower; and
 h. applying excitation to the winding sections sufficient to produce, from the electrode, an electrical discharge between 3 and 300 meters in length.

In another embodiment, collapsing the tower components for transport or storage comprises the steps of:
 a. detaching the generator from a source of excitation;

b. releasing pressure from the internal volume of the winding sections;
c. collapsing the winding sections into a compact format;
d. disassembling the electrode into discrete modular components;
e. arranging the modular components of the electrode and the winding sections into a compact configuration that can be efficiently transported.

The high voltage electrode 50 as shown in FIG. 1, FIG. 5 and FIG. 7 collects charge produced by the winding sections 20 and provides a minimum outer envelope 51 with an average radius of curvature that can contain the high voltages generated by the tower without forming premature arc breakouts into the surrounding air. In an embodiment (not shown) the tower arrangement can be operated without a top electrode in place. Omitting the top electrode reduces the overall construction and deployment costs, but with the tradeoff of reduced arc performance, greater frequency instability and increased risk of damage to the upper winding sections.

The outer envelope 51 refers to the average outer surface curvature, if all of the voids and protrusions in the outer surface were smoothed over. It is important to note that for this application the electrode surface can actually tolerate a large number of voids without significantly affecting its ability to contain high voltage, provided that the voids are relatively small compared to the overall electrode size. This is due to the tendency of electric fields to smoothly integrate or 'average' the overall contour of the electrode.

Figure 8:
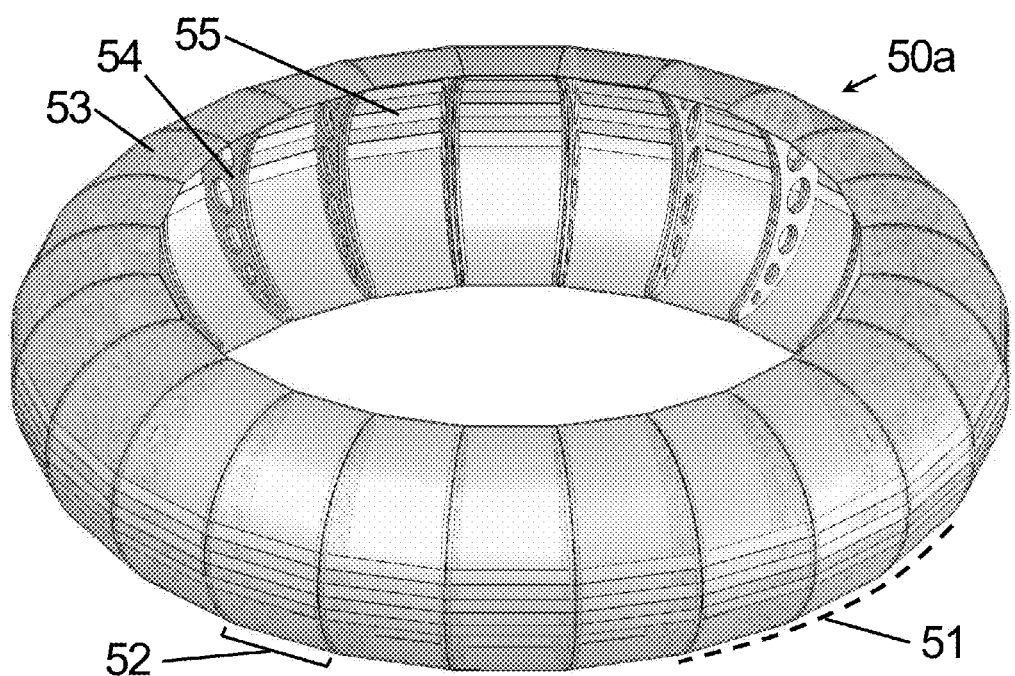
FIG. 8 shows a top electrode comprising an array of curved, collapsible, conductive modular components, according to an embodiment of the invention.

In an embodiment shown in FIG. 8, the top electrode 50a comprises a number of collapsible conductive sections 52 configured to form an overall toroidal or spherical envelope shape 51 that can readily support high voltage while suppressing premature arc breakout. Each collapsible section 52 comprises a flexible sheet of electrically conductive mesh 53, held into a curved outer shape by a system of interior forms 54 and stiffeners 55. For transport and storage, the conductive mesh sheets 53 can be released, flattened and stacked, providing a highly compact format. It is useful if the conductive sections form an overall envelope shape that provides an outer radius of curvature large enough to support the desired output voltage. The minimum effective radius of curvature for high voltage electrode 50 varies with the desired output voltage and is dependent on many factors, but can be approximated by the relation:

Minimum R.O.C.[m]=Voltage/Dielectric Strength of Air

In the above equation, the Dielectric Strength of Air is approximately 1 MV/m.

For producing long electrical discharges at least 3 meters in length, a minimum of 350,000 volts is needed as mentioned earlier. This requires a top electrode with a minimum R.O.C. of about 350 mm, to minimize premature arc breakout.

Figure 9:
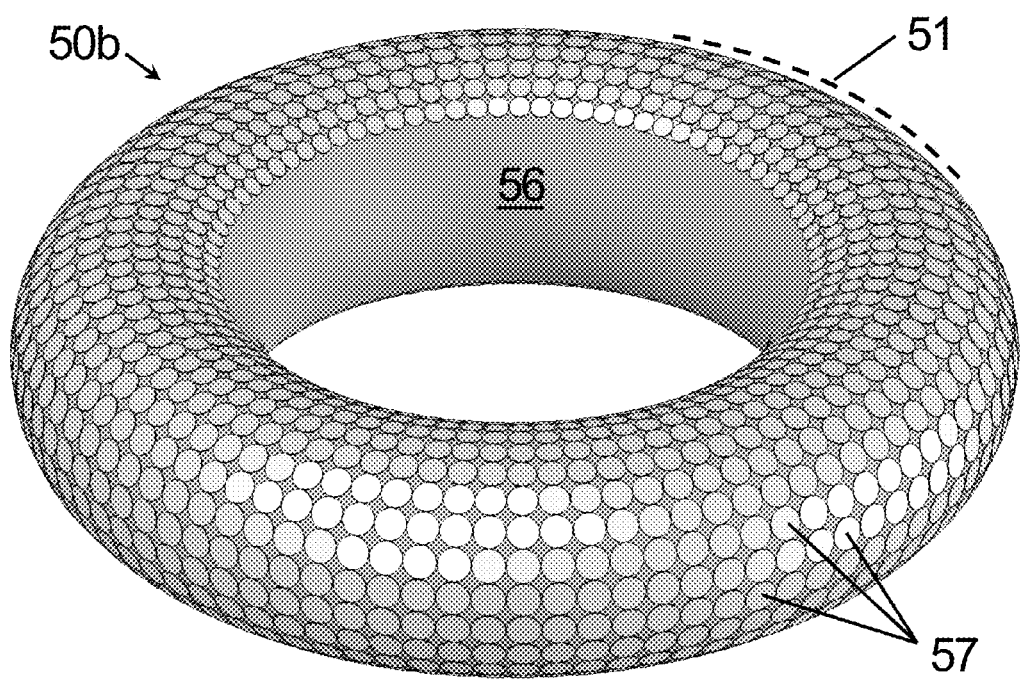
FIG. 9 shows a top electrode comprising an inflatable envelope supporting an array of flat conductive modular components, according to another embodiment of the invention.

FIG. 9 illustrates another embodiment of an electrode for high voltage operation. An inflatable membrane 56 is configured to support a number of smaller attached conductive elements 57 in extended positions that approximate an overall toroidal or spherical envelope shape 51 capable of supporting high voltage. In this embodiment the conductive elements 57 can be small, discrete, interconnected conductive plates, loops of wire, or metalized object of any shape. A person skilled in electrostatics would note that if the conductive elements 57 cover a significant percentage of the outward-facing surface of membrane 56 and are small compared to the outer envelope radius described by 51, then the entirety of conductive elements will support electric fields nearly as well as if the entire top electrode comprised a solid piece of metal.

For ease of transport or storage, the inflatable membrane 56 can be simply deflated and folded along with the attached conductive elements into a considerably more compact arrangement. In another embodiment, the inflatable membrane 56 can be directly coated with a conductive material (not shown) that is flexible enough to withstand folding and stretching of the inflatable membrane. The conductive coating would then form the outer envelope and support the electrical discharge. It is useful for the conductive material forming the outer envelope to have a conductivity of at least 100 S/m, in order to minimize self-heating at the arc attachment point.

In summary, the embodiments of the invention, as described herein, include a collapsible and highly transportable high voltage generator, capable of generating electrical discharges greater than three meters in length. The unique collapsible nature allows an economical scaling of the machine to very large dimensions while maintaining a collapsible mode that allows for efficient transport or storage.

The invention claimed is:

1. A modular high voltage generation device comprising:
   (a) two or more elemental winding sections configured to form a singular electrical winding, and
   (b) a collapsible, electrically insulated mechanical support system that can configure said winding sections into either a compact arrangement suitable for transport, or into an expanded arrangement suitable for producing high voltage, and
   whereby the said collapsible mechanical support system and said singular electrical winding are configured to support extra-high voltages of 350,000 volts or greater, and
   whereby said device is configured to produce a localized electrical discharge in air greater than three meters and less than three hundred meters in length.

2. The device of claim 1 wherein the arrangement of winding sections has a collapsible top electrode with a toroidal shape.

3. The device of claim 1, wherein said collapsible mechanical support system comprises at least one pressurized lifting device.

4. The device of claim 1, wherein said collapsible mechanical support system comprises mechanical linkage configured to support and adjust the vertical position of the winding sections and top electrode.

5. A method of operating a collapsible high-voltage electrical discharge generator, comprising the steps of:
   a. providing two or more hollow electrical elemental winding sections configured to form a singular electrical winding; tower arrangement and to connect electrically with one another;
   b. configuring an inflatable internal volume inside said winding sections;
   c. pressurizing said internal volume for the purpose of configuring said winding sections into a tower arrangement;
   d. providing modular electrode components configured to form a top electrode, which can support electrical discharges in air between three and three hundred meters in length;
   e. placing said toroidal electrode at the top of the tower;
   f. making an electrical connection between the electrode and the tower; and
   g. applying excitation to the winding sections sufficient to produce, from the electrode, an electrical discharge in air between three and three hundred meters in length.

6. The method of claim 5, wherein steps b through c comprise using internal mechanical linkage to provide support for the winding sections.

7. The method of claim 5, wherein steps b through c comprise using external cranes or scaffolding to provide support for the winding sections.

\* \* \* \* \*